United States Patent
Schlanger et al.

(10) Patent No.: US 6,931,075 B2
(45) Date of Patent: Aug. 16, 2005

(54) EVENT DETECTION WITH A DIGITAL PROCESSOR

(75) Inventors: Steven Eric Schlanger, Flagstaff, AZ (US); Randy L. Yach, Phoenix, AZ (US)

(73) Assignee: Microchip Technology Incorporated, Chandler, AZ (US)

( * ) Notice: Subject to any disclaimer, the term of this patent is extended or adjusted under 35 U.S.C. 154(b) by 930 days.

(21) Appl. No.: 09/827,273

(22) Filed: Apr. 5, 2001

(65) Prior Publication Data

US 2002/0150178 A1 Oct. 17, 2002

(51) Int. Cl.$^7$ .............. H04L 27/00; H04L 9/00; H03K 3/12
(52) U.S. Cl. .............. 375/259; 327/218; 713/176
(58) Field of Search .............. 375/220, 259, 375/340; 370/366; 713/172, 176, 179; 327/217, 218, 225

(56) References Cited

U.S. PATENT DOCUMENTS

| | | | | |
|---|---|---|---|---|
| 3,898,689 A | * | 8/1975 | D'Orazio et al. | 360/40 |
| 4,692,635 A | * | 9/1987 | Rapp | 327/78 |
| 4,740,890 A | * | 4/1988 | William | 713/200 |
| 4,940,904 A | * | 7/1990 | Lin | 327/256 |
| 5,087,828 A | | 2/1992 | Sato et al. | 307/269 |
| 5,438,328 A | * | 8/1995 | Kweon | 340/825.63 |
| 5,818,274 A | * | 10/1998 | Lombreschi et al. | 327/217 |
| 5,822,386 A | | 10/1998 | Pawelski | 375/373 |
| 5,982,837 A | * | 11/1999 | Earnest | 375/377 |
| 6,075,385 A | * | 6/2000 | Dorweiler et al. | 326/93 |
| 6,260,146 B1 | * | 7/2001 | Mos et al. | 713/176 |
| 2003/0034818 A1 | * | 2/2003 | Shenai et al. | 327/218 |

FOREIGN PATENT DOCUMENTS

| | | | | |
|---|---|---|---|---|
| EP | 0 405 968 A1 | 6/1990 | | H04L/7/033 |
| EP | 0 639 004 A1 | 7/1994 | | H03K/5/135 |
| EP | 0 658 995 A1 | 12/1994 | | H04L/7/033 |

OTHER PUBLICATIONS

PCT International Search Report with Notification of Transmittal of International Search Report, PCT/US 02/10195, 8 pages.

* cited by examiner

Primary Examiner—Amanda T. Le
Assistant Examiner—Lawrence B. Williams
(74) Attorney, Agent, or Firm—Baker Botts L.L.P.

(57) ABSTRACT

A bistable memory device changes logic state each time an event occurs. The bistable memory device has an logic output coupled to a digital processor input. The digital processor reads the logic state of the bistable memory device from its logic output and compares the logic state read to a stored previous logic state obtained from a previous read. If the logic state read and the stored previous logic state are the same, then no event has occurred during the time between the read and previous read of the logic states of the bistable memory device. If different, then an event has occurred during the time between the read and previous read of the logic states of the bistable memory device. The event detection may be used in combination with a digital system communicating by serial digital data transmissions.

4 Claims, 6 Drawing Sheets

EVENT DETECTION WITH A DIGITAL PROCESSOR

FIELD OF THE INVENTION

The present invention relates generally to digital electronics, and more particularly to event detection with a digital processor.

BACKGROUND OF THE INVENTION TECHNOLOGY

Digital processors are often called upon to act on the presence or absence of events such as electrical pulses, pulses of light, and so forth. The processor makes decisions based upon the occurrence of one or more events. Typically each event is presented to the processor as a pulse or as a transition from one logic level to another. The events, representing information, occur within certain periods of time and may only be present for only a very short time. These events are often so fast that they must be detected by fast acting event capture circuits, e.g., latches, flip-flops, counters and the like. The fast acting event capture circuits are then subsequently read by the digital processor which may then act upon the presence or absence of the detected event.

The event capture circuit may be external to the digital processor and is adapted to be read by the processor. Whenever the processor reads the event capture circuit and determined that an event has occurred, generally, the processor will reset the event capture circuit for detecting the next event. In this way the processor can check or pole the event capture circuit for an event occurrence during a more flexible time period (e.g., any time after the event). So long as the processor checks and resets the event capture circuit before a second event can occur, each event may be detected by the processor.

When the occurrence of an event is read by the processor, the processor must then reset the event capture circuit so that it may capture the next event. Resetting the event capture circuit requires the processor to perform a write operation to the event capture circuit reset input. Thus, the processor must do a plurality of read operations in determining whether an event has been captured by the event capture circuit. Once the occurrence of the event is read, the processor must than do a write operation to immediately reset the event capture circuit. A processor write operation takes valuable processor instruction execution time and thus reduces the time available for other processor operations or restricts the maximum rate in which events can occur that the processor may determine. In addition, the reset output from the processor uses up a valuable input/output (I/O) pin of the processor package.

Figure 1:
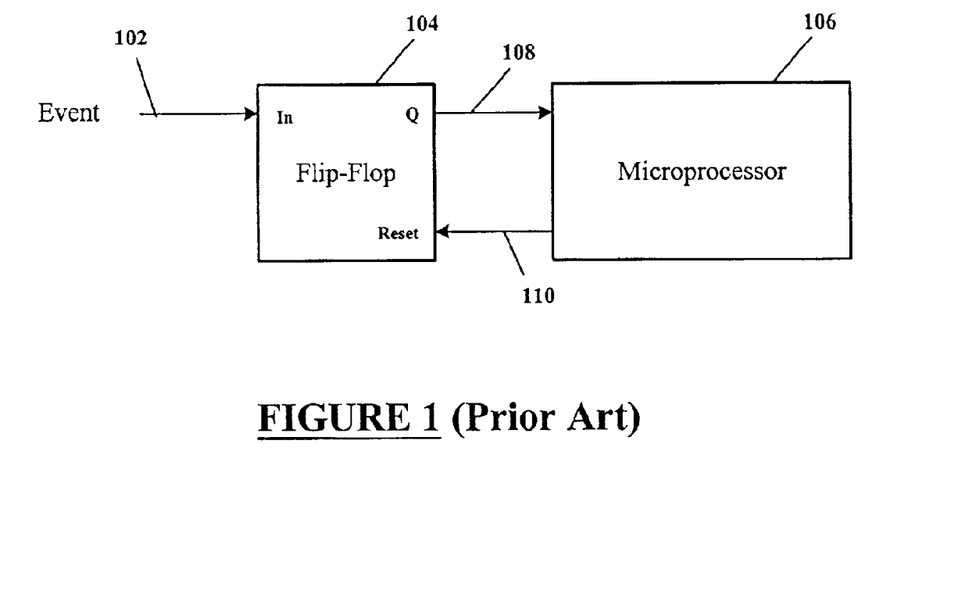
FIG. 1 illustrates a schematic block diagram of a prior art event detector comprising a flip-flop and a microprocessor.

FIG. 1 illustrates a schematic block diagram of a prior art event capture circuit comprising a flip-flop 104 and a microprocessor 106. The Q output of the flip-flop 104 goes from a first logic level to a second logic level whenever an event 102 is detected by the flip-flop 104 input. The microprocessor 106 reads the output 108 of the flip-flop 104, and when the second logic level is detected, the microprocessor 106 resets the flip-flop 104 with a reset signal 110. The prior art circuit of FIG. 1 requires both an input to and an output from the microprocessor 106. Valuable program instruction time is spent resetting the flip-flop 104, and two dedicated integrated circuit package connections are required.

What is needed is a faster and more efficient way of detecting the occurrence or non-occurrence of events with a digital processor.

SUMMARY OF THE INVENTION

The invention overcomes the above-identified problems as well as other shortcomings and deficiencies of existing technologies by providing a method, system and apparatus for event detection with a digital processor. A bistable memory device changes its logic state each time an event occurs and a digital processor periodically reads the logic state of the bistable memory device so as to make a comparison of a presently read logic state with a previously read and stored logic state for determining whether an event has occurred since the last time the bistable memory device was read. If the logic level of the logic state read and the logic level stored from the previously read logic state are the same, then no event has occurred during the time between the read and previous read of the logic states of the bistable memory device. If different, then an event has occurred during the time between the read and previous read logic states of the bistable memory device.

The digital processor may be for example, but not limited to, a microcontroller, a microprocessor, a programmable logic array (PLA), an application specific integrated circuit (ASIC), digital logic and the like. The bistable memory device may be for example, but not limited to, a flip-flop, a counter, a clocked latch and the like.

In accordance with an exemplary embodiment of the present invention, an apparatus for detecting an event comprises a bistable memory device and a digital processor. The bistable memory device has an input adapted for detecting the occurrence of an event and an output representing a logic state of said bistable memory device, wherein the logic state is at either a first or a second logic level such that the logic level of said logic state changes each time the event is detected. The digital processor has an input coupled to the output of the bistable memory device, whereby the digital processor periodically reads the logic state and stores the logic level thereof, wherein the digital processor compares the logic level of a subsequently read logic state with the stored logic level so as to determine whether the stored logic level is the same or different than the logic level of the subsequently read logic state, if different then an event has occurred and if the same then no event has occurred.

In addition, the present invention is also directed to methods of operation for detecting an event with a bistable memory device and a digital processor, the method comprises the steps of changing a logic state of a bistable memory device each time an event is detected, wherein the logic state is at either a first or a second logic level; reading the logic state of the bistable memory device with a digital processor; storing the logic level of the read logic state in the digital processor; and comparing the stored logic level with the logic level of a subsequently read logic state so as to determine whether the stored logic level is the same or different than the logic level of said subsequently read logic state, if different then an event has occurred and if the same then no event has occurred.

The bistable memory device may be adapted to change its logic state upon detecting a positive transition signifying an event, e.g., the event input signal goes from a logic low to a logic high. The bistable memory device may also be adapted to change its logic state upon detecting a negative transition signifying an event, e.g., the event input signal goes from a logic high to a logic low. The bistable memory device may also be adapted to change its logic state upon detecting a positive pulse signifying an event, e.g., the event input signal briefly goes from a logic low to a logic high and then back to a logic low. The bistable memory device may also be adapted to change its logic state upon detecting a negative pulse signifying an event, e.g., the event input signal briefly goes from a logic high to a logic low and then back to a logic high.

It is contemplated and within the scope of the present invention that a plurality of events may be detected by using a plurality of bistable memory devices in combination with one or more digital processors.

The present invention may be used in combination with a digital system adapted for serial digital data communications, wherein the system comprises a transmitter and a receiver, the transmitter being adapted for sending serially encoded digital information and the receiver being adapted for receiving serially encoded digital information. A computer adapted for serial digital data communications. A event detector comprising a first bistable memory device, the bistable memory device having an input adapted for detecting the occurrence of an event and an output representing a logic state of the bistable memory device, wherein the logic state is at either a first or a second logic level such that the logic level of the logic state changes each time the event is detected. A second bistable memory device, the second bistable memory device having an input adapted for detecting the occurrence of an event and an output representing a logic state of the second bistable memory device, wherein the logic state is at either a first or a second logic level such that the logic level of the logic state changes each time the event is detected. A digital processor having an input coupled to the output of the first bistable memory device and another input coupled to the output of the second bistable memory device, whereby the digital processor periodically reads the logic states and stores the logic levels thereof, wherein the digital processor compares the logic level of a subsequently read logic state with the stored logic level so as to determine whether the stored logic level is the same or different than the logic level of the subsequently read logic state, if different then an event has occurred and if the same then no event has occurred.

The event detector is coupled between the transmitter and the computer, and the receiver and the computer such that the first bistable memory device is coupled to the receiver and the second bistable memory device is coupled to a serial output of the computer. The transmitter may be adapted for transmitting infrared, ultraviolet, radio frequency, microwave or ultrasonic. The receiver is selected from the group consisting of infrared, ultraviolet, radio frequency, microwave and ultrasonic. The computer may be for example a microcontroller, microprocessor, digital signal processor, reduced instruction set computer (RISC), or a complex instruction set computer (CISC).

A technical advantage of the present invention is faster event detection.

Another technical advantage a reduction in the number of input-output pins required for a digital processor integrated circuit package.

Another technical advantage is detection of events that occur only briefly.

Another technical advantage of the present invention is that the occurrence of an event can be checked for at anytime before the next event occurs, thus no wait nor interrupt instructions in a software program are necessary.

A feature of the present invention is the capture and retention of the occurrence of an event so that the occurrence may be determined at a time thereafter.

Features and advantages of the invention will be apparent from the following description of the embodiments, given for the purpose of disclosure and taken in conjunction with the accompanying drawings.

BRIEF DESCRIPTION OF THE DRAWINGS

A more complete understanding of the present disclosure and advantages thereof may be acquired by referring to the following description taken in conjunction with the accompanying drawings, wherein.

While the present invention is susceptible to various modifications and alternative forms, specific exemplary embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF SPECIFIC EMBODIMENTS

The present invention is directed to a method, system and apparatus for event detection with a digital processor. In the exemplary embodiments of the invention, a bistable memory device changes its logic state each time an event occurs and a digital processor periodically reads the logic state of the bistable memory device so as to make a comparison of a presently read logic state with a previously read and stored logic state for determining whether an event has occurred since the last time the bistable memory device was read. If the logic state read and the stored previously read logic state are the same, then no event has occurred during the time between the read and previous read of the logic states of the bistable memory device. If different, then an event has occurred during the time between the read and previous read of the logic states of the bistable memory device.

Referring now to the drawings, the details of exemplary embodiments of the present invention are schematically illustrated. Like elements in the drawings will be represented by like numbers, and similar elements will be represented by like numbers with a different lower case letter suffix.

Figure 2:
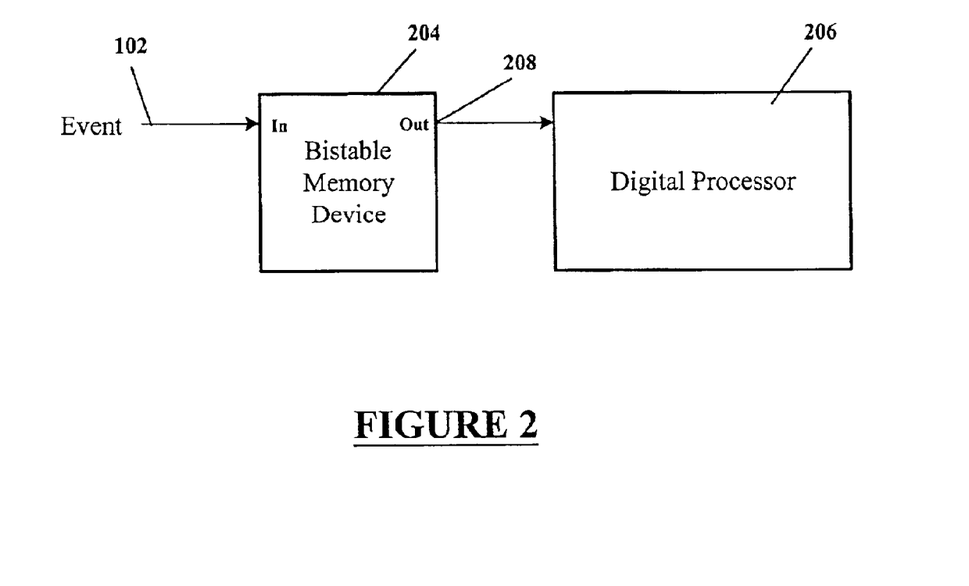
FIG. 2 illustrates a schematic block diagram of an event detector, according to an exemplary embodiment of the invention.
Figure 3:
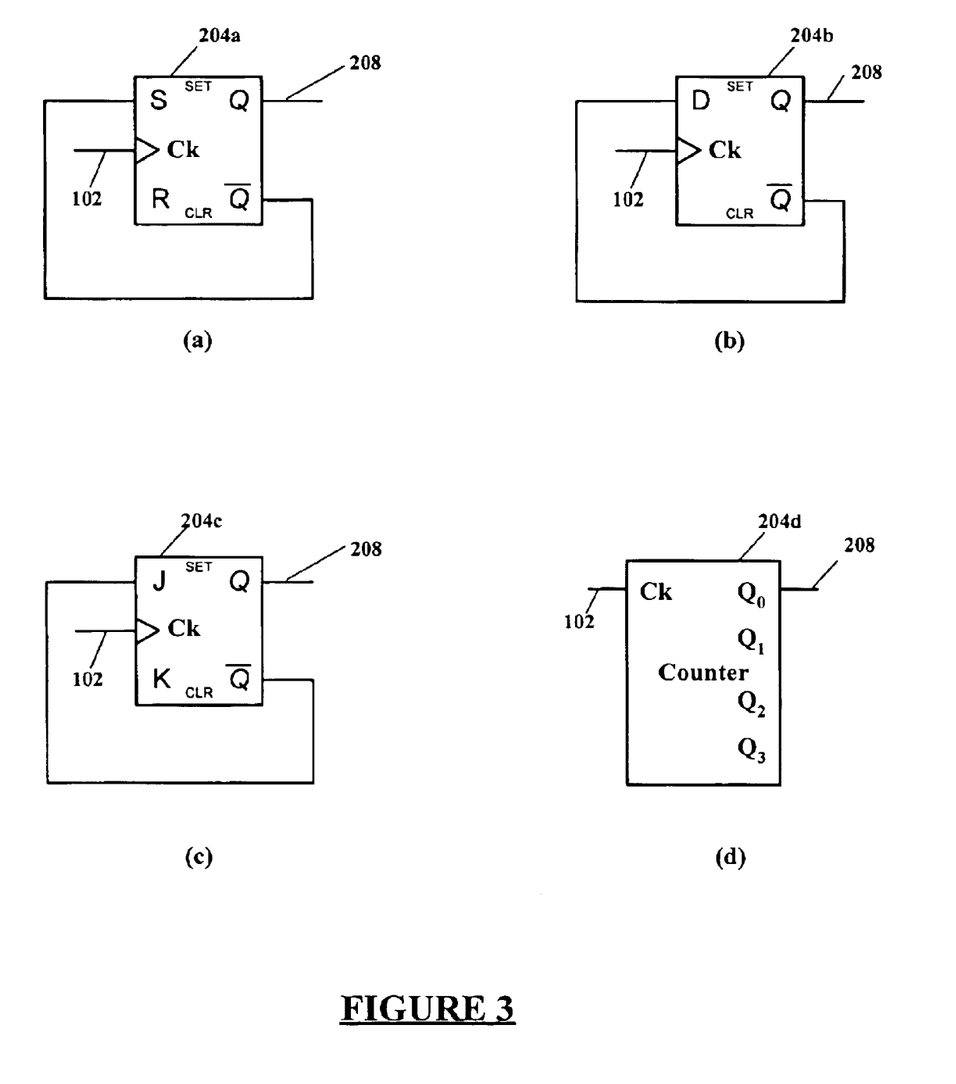
FIGS. 3a–3d illustrate schematic diagrams of various exemplary bistable memory devices, according to the exemplary embodiment of FIG. 2.

Referring to FIG. 2, depicted is a schematic block diagram of an event detector, according to an exemplary embodiment of the invention. The event detector is generally depicted by the numeral 200 and comprises a bistable memory device 204 and a digital processor 206. FIGS. 3a–3d illustrate various exemplary bistable memory devices 204. The bistable memory device 204a is an R-S flip-flop (FIG. 3a) device 204b is a D flip-flop (FIG. 3b), device 204c is a J-K flip-flop (FIG. 3c), and device 204d is a counter (FIG. 3d). It is contemplated and within the scope of the present invention that the bistable memory device 204 may be any device that will toggle and retain its output state when an event 102 is detected on its input, e.g., toggle flip-flop, latch, counter (synchronous and asynchronous) and the like. The output 208 of the bistable memory device 204 is at a logic state of either a first logic level or a second logic level. Each time an event 102 is detected the logic state at the output 208 changes. Thus the logic state of the output 208 alternates between the first and second logic levels for each event 102.

Figure 4:
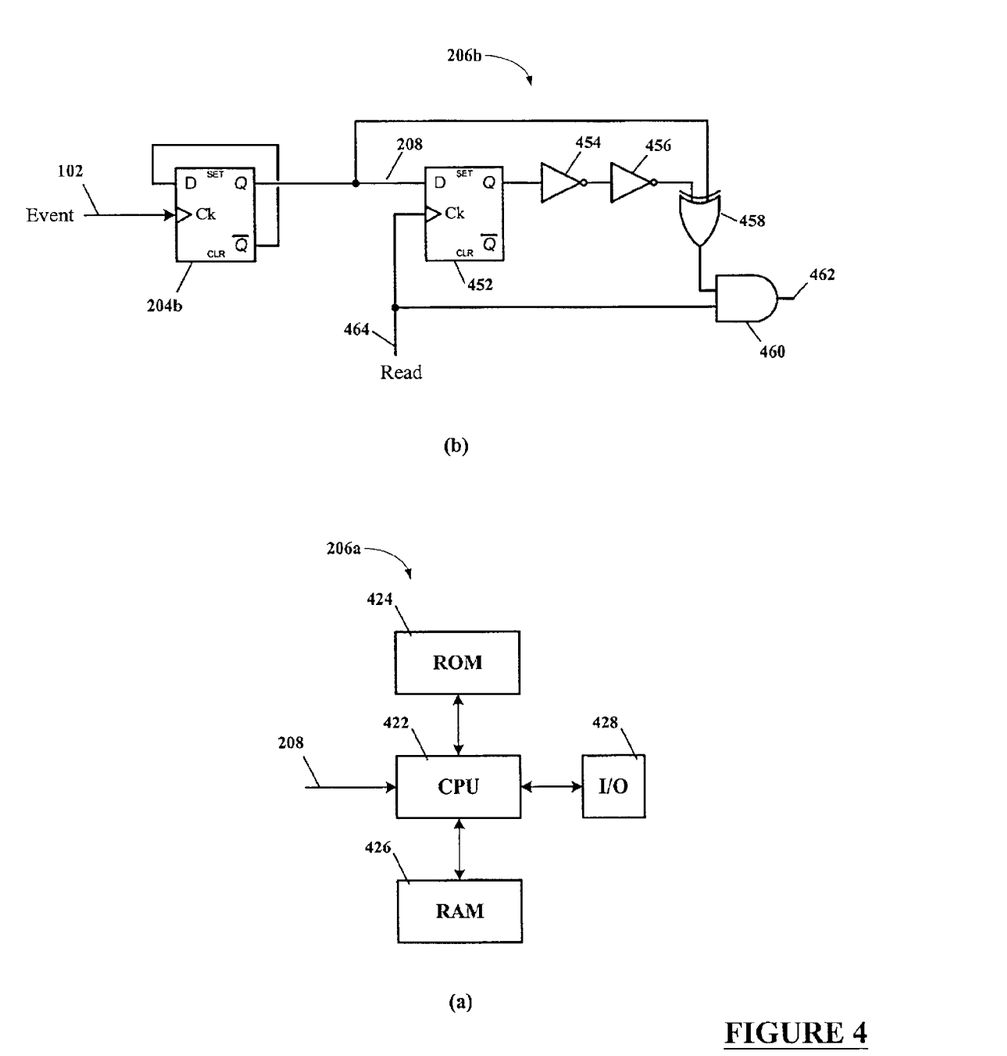
FIGS. 4a and 4b illustrate schematic block diagrams of exemplary digital processors, according to the exemplary embodiment of FIG. 2.

Referring to FIG. 4a and 4b, depicted are block diagrams of exemplary digital processors. As depicted in FIG. 4a, the digital processor 206a may comprise a central processing unit (CPU) 422, a read only memory (ROM) 424, a random access memory (RAM) 426 and input-output (110) 428. The CPU 422 reads the logic state of the output 208 and compares the logic level of the logic state read to a stored logic level of a previously read logic state. If the logic level of the logic state read and the logic level stored from the previously read logic state are the same, then no event has occurred during the time between the read and previous read of the logic states of the bistable memory device. If different, then an event has occurred during the time between the read and previous read logic states of the bistable memory device.

In another embodiment depicted in FIG. 4b, the digital processor 206b may comprise digital logic gates and a storage register such as, for example but not limited to, a flip-flop 452. The bistable memory device 204 (FIG. 2) is represented by a D flip-flop 204b (FIG. 3b) having a Q output 208 connected to an input of the flip-flop 452. The logic state at the Q output 208 of the flip-flop 204b consists of two logic levels, a first logic level and a second logic level. The first logic level may be a logic high and the second logic level may be a logic low, or visa-versa. For example, an event 102 toggles the logic state of the output 208 to the first logic level. A next event 102' toggles the logic state of the output 208 to the second logic level. A subsequent event 102" toggles the logic state of the output 208 back to the first logic level, etc. The logic state of the output 208 remains at one of the two logic levels irrespective of whether the event 102 is momentary or of short duration. The event 102 may also be depicted as a transition from a logic low to a logic high, or a logic high to a logic low (referred to herein as "edge triggering"). Thus a constant logic level of the logic state at the output 208 of the flip-flop 204b is maintained between detection of events.

Figure 5:
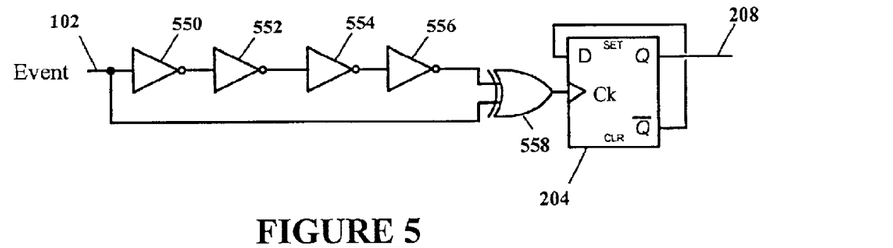
FIG. 5 illustrates a schematic diagram of an exemplary event detection circuit that detects both positive to negative and negative to positive logic level transitions.

The digital processor 206b comprises a D flip-flop 452, inverters 454 and 456, XOR 458, and AND 460. The output 208 of the flip-flop 204b is connected to the D input of the flip-flop 452 and an input of the XOR 458. The output of the flip-flop 452 is connected to the input of the inverter 454. The output of the inverter 454 is connected to the input of the inverter 456. The output of the inverter 456 is connected to another input of the XOR 458. The output of the XOR 458 is connected to an input of the AND 460. A read signal 464 is connected to the clock input of the flip-flop 452 and another input of the AND 460. When the read signal 464 (for example positive going edge or pulse) is asserted, the logic level at the output of the XOR 458 and the read signal 464 are anded in the AND 460. If both are at a logic high, the output 462 will also be at a logic high, indicating the detection of a new event. The output 462 will be a pulse since the output of the flip-flop 452 will assume the new logic level from the output 208 of the flip-flop 204b when the read signal 464 is asserted. The inverters 454 and 456 may or may not be required depending upon the propagation delay through the flip-flop 452. Whenever the logic levels at the inputs of the XOR 458 are different, the output of the XOR 458 will be at a logic high. The flip-flop 452 stores the last read logic level from the output 208 of the flip-flop 204b and retains this logic level until another read operation is performed Referring to FIG. 5, depicted is a schematic diagram of an exemplary event detection circuit that detects both positive to negative and negative to positive logic level transitions. Inverters 550–556 are used to introduce a time delay so that any time there is a logic level transition of the event 102 input, the XOR 558 will output a pulse to the flip-flop 204, which causes the Q output 208 to transition from one logic level to another. This circuit is especially useful when detecting both positive and negative event transitions is required.

Figure 6:
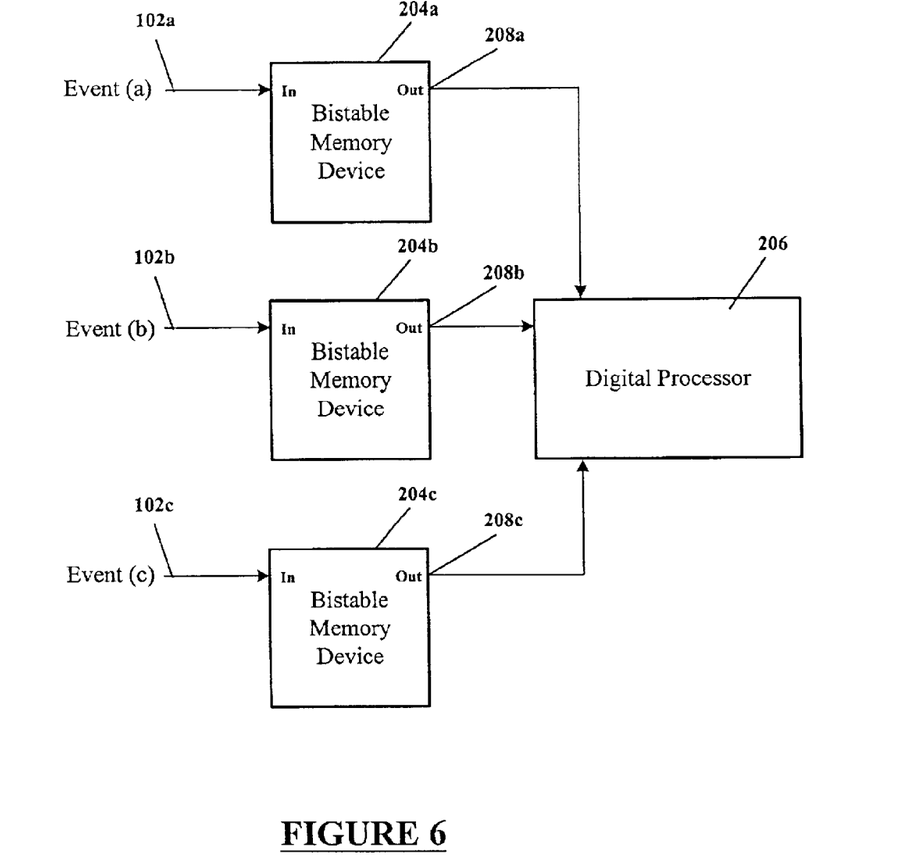
FIG. 6 illustrates a schematic block diagram of a plurality of events detector, according to an exemplary embodiment of the invention.

Referring to FIG. 6, depicted is a schematic diagram of a plurality of events detector, according to an exemplary embodiment of the invention. The plurality of events detector comprises a plurality of bistable memory devices 204 and a digital processor 206. More than one digital processor 206 may be coupled to the plurality of bistable memory devices 204. The outputs 208a–208c of the bistable memory devices 204a–204c are at a logic state of either a first logic level or a second logic level. Each time events 102a–102c are detected the logic state of each of the respective outputs 208a–208c change. Thus the logic state of the outputs 208a–208c alternate between the first and second logic levels for each of the respective events 102a–102c. Any number of events 102 may be detected, according to the present invention.

Figure 7:
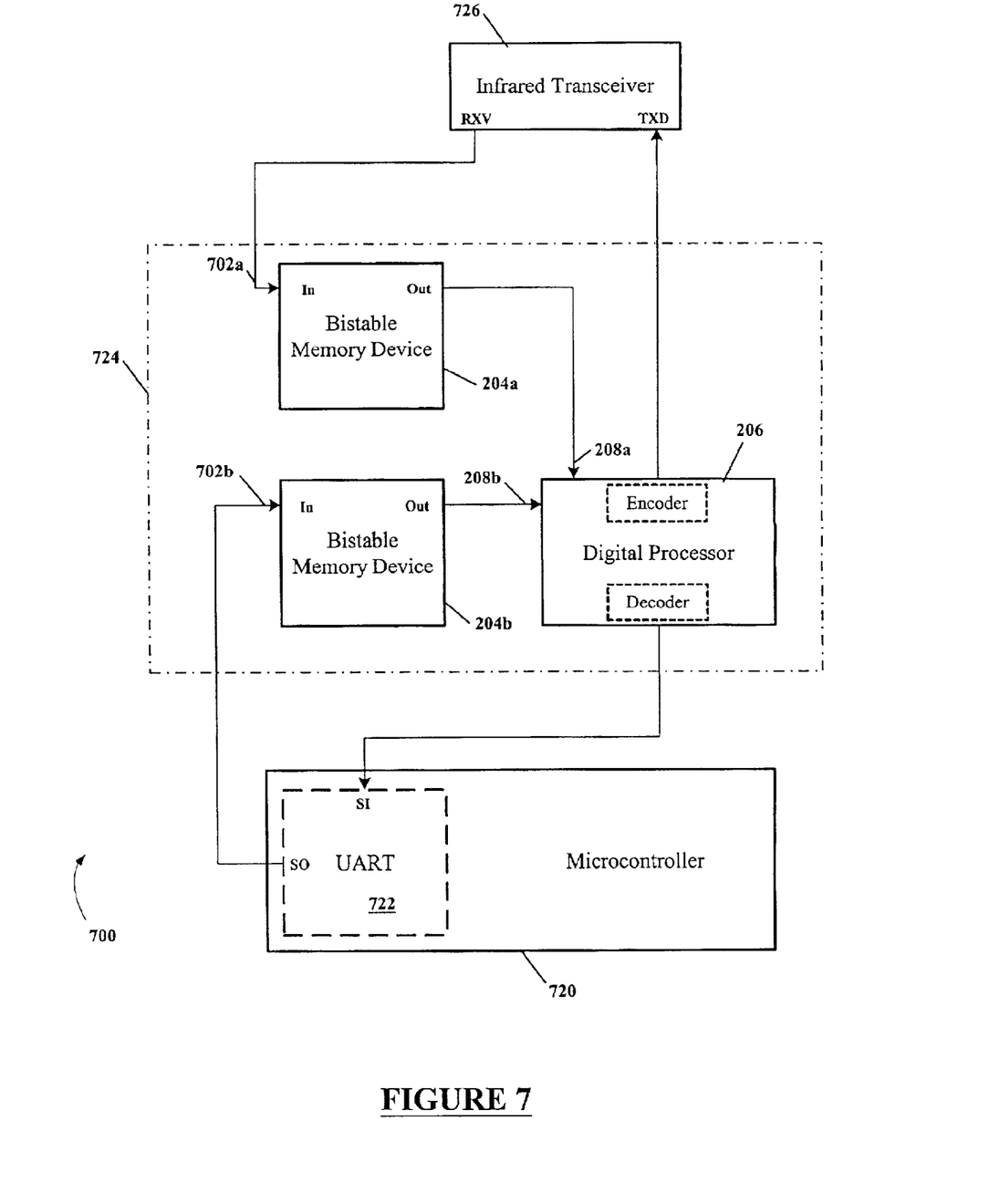
FIG. 7 illustrates a schematic block diagram of a system utilizing an exemplary embodiment of the invention.

Referring to FIG. 7, depicted is a schematic block diagram of a system utilizing an exemplary embodiment of the invention. For example but without limiting the scope of the invention, a two event detector, generally represented by the numeral 724, may be utilized in combination with a wireless system, generally represented by the numeral 700, comprising an infrared communications transceiver in combination with a microcontroller, microprocessor, telecommunications processor and the like (720). The wireless system 700 may comprise a microcontroller 720 having a universal asynchronous receiver-transmitter (UART) 722, bistable memory devices 204a and 204b, a digital processor 206 and an infrared transceiver 726. The UART 722 sends and receives serial digital signals to and from the event detector 724. The event detector is interposed between the infrared transceiver 726 and the microcontroller 720. The digital processor 206 may also perform other functions such as for example, but not limited to, changing UART standard 16550 serial format into IRDA format, and visa-versa.

Figure 8:
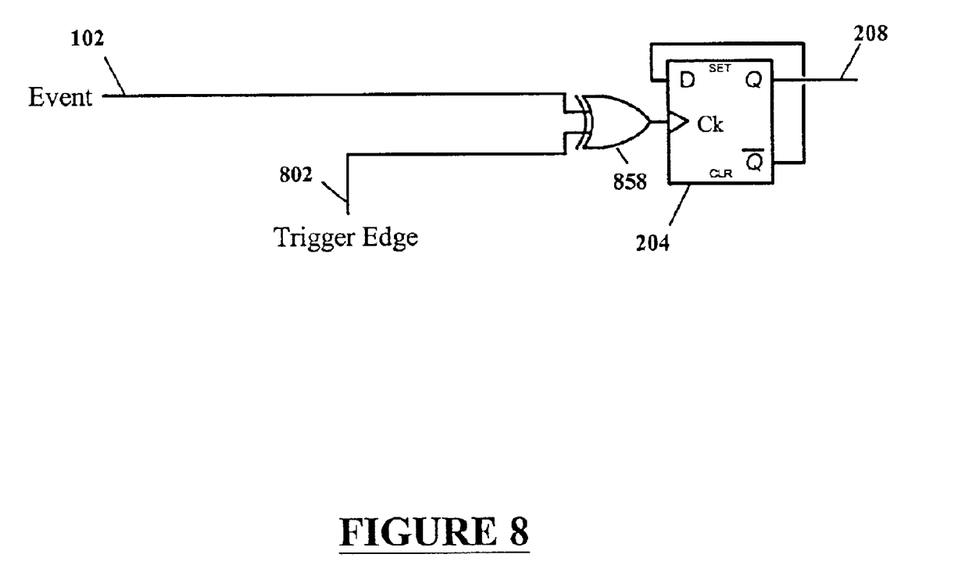
FIG. 8 illustrates a schematic diagram of an exemplary event detection circuit that selectably detects either a positive to negative logic level transition or a negative to positive logic level transition.

Referring to FIG. 8, depicted is a schematic diagram of an exemplary event detection circuit that selectably detects either a positive to negative logic level transition or a negative to positive logic level transition. An XOR 858 has an output coupled to the flip-flop 204. Each time the output of the XOR 858 transitions from a low to a high logic level the output 208 of the flip-flop 204 toggles. The XOR 858 has a first input adapted to receive the event signal 102 and a second input connected to a trigger edge selection signal 802. When the trigger edge selection signal is at a logic low, the output of the XOR 858 will clock the flip-flop 204 whenever the event 102 transitions from a low to a high logic level. When the trigger edge selection signal is at a logic high, the output of the XOR 858 will clock the flip-flop 204 whenever the event 102 transitions from a high to a low logic level. This circuit is especially useful when it is desired to select either a positive or negative event transition.

The present invention may be adapted to accommodate an infrared standard such as Infrared Data Association (IrDA) Serial Physical Layer Specification, version 1.3 (Oct. 15, 1998) and IrDA Control Specification, final revision (Jun. 30, 1998), both IrDA standards being incorporated by reference herein for all purposes. An advantage of this exemplary embodiment of the invention is less overhead for receiving signals from the infrared transceiver 726 and microcontroller 720. The infrared transceiver may be for example Hewlett Packard part number HSDL-1001.

It is contemplated and within the scope of the present invention that the wireless communications may be by radio transmission, ultrasonic, ultraviolet and microwave transmission. A wired connection such as copper cable or fiber-optic glass stranded cable may also be used equally effectively with the present invention. The microcontroller 720 may be any type of computer having serial digital data communications capabilities, e.g., a microcomputer with a UART, a central processing unit (CPU) and UART, a reduced instruction set computer (RISC) or complex instruction set computer (CISC) and a UART, a digital signal processor and the like.

The invention, therefore, is well adapted to carry out the objects and attain the ends and advantages mentioned, as well as others inherent therein. While the invention has been depicted, described, and is defined by reference to exemplary embodiments of the invention, such references do not imply a limitation on the invention, and no such limitation is to be inferred. The invention is capable of considerable modification, alternation, and equivalents in form and function, as will occur to those ordinarily skilled in the pertinent arts and having the benefit of this disclosure. The depicted and described embodiments of the invention are exemplary only, and are not exhaustive of the scope of the invention. Consequently, the invention is intended to be limited only by the spirit and scope of the appended claims, giving full cognizance to equivalents in all respects.

What is claimed is:

1. A digital system adapted for serial digital data communications, said system comprising:

a transmitter and a receiver, said transmitter being adapted for sending serially encoded digital information and said receiver being adapted for receiving serially encoded digital information;

a computer adapted for serial digital data communications;

an event detector comprising:

a first bistable memory device, said bistable memory device having an input adapted for detecting the occurrence of an event and an output representing a logic state of said bistable memory device, wherein said logic state is at either a first or a second logic level such that the logic level of said logic state changes each time the event is detected;

a second bistable memory device, said bistable memory device having an input adapted for detecting the occurrence of an event and an output representing a logic state of said bistable memory device, wherein said logic state is at either a first or a second logic level such that the logic level of said logic state changes each time the event is detected; and a digital processor, said digital processor having an input coupled to the output of said first bistable memory device and another input coupled to the output of said second bistable memory device, whereby said digital processor periodically reads said logic states and stores the logic levels thereof, wherein said digital processor compares the logic level of a subsequently read logic state with the stored logic level so as to determine whether the stored logic level is the same or different than the logic level of said subsequently read logic state, if different then an event has occurred and if the same then no event has occurred;

wherein said event detector is coupled between said transmitter said computer, and said receiver and said computer such that said first bistable memory device is coupled to said receiver and said second bistable memory device is coupled to a serial output of said computer.

2. The digital system of claim 1, wherein the transmission of said transmitter is selected from the group consisting of infrared, ultraviolet, radio frequency, microwave and ultrasonic.

3. The digital system of claim 1, wherein the reception of said receiver is selected from the group consisting of infrared, ultraviolet, radio frequency, microwave and ultrasonic.

4. The digital system of claim 1, wherein said computer is selected from the group consisting of a microcontroller, microprocessor, digital signal processor, reduced instruction set computer (RISC), complex instruction set computer (CISC).

* * * * *